United States Patent [19]

Jelks et al.

[11] 4,414,738

[45] Nov. 15, 1983

[54] OPTICAL LITHOGRAPHIC TECHNIQUE FOR FABRICATING SUBMICRON-SIZED JOSEPHSON MICROBRIDGES

[75] Inventors: Edward C. Jelks; George L. Kerber; Howard A. Wilcox, all of San Diego, Calif.

[73] Assignee: The United States of America as represented by the Secretary of the Navy, Washington, D.C.

[21] Appl. No.: 230,246

[22] Filed: Feb. 2, 1981

[51] Int. Cl.³ .............................................. H01L 39/22
[52] U.S. Cl. ........................................ 29/579; 29/571; 357/5
[58] Field of Search ................... 29/576 R, 579, 571, 29/599; 357/5; 428/620, 645, 662

[56] References Cited

U.S. PATENT DOCUMENTS

| | | | |
|---|---|---|---|
| 3,951,708 | 4/1976 | Dean | 29/579 X |
| 3,999,203 | 12/1976 | Lahiri | 357/5 |
| 4,000,014 | 12/1976 | Winter | 29/599 X |
| 4,264,916 | 4/1981 | Tsang | 357/5 |

Primary Examiner—Brian E. Hearn
Assistant Examiner—David A. Hey
Attorney, Agent, or Firm—Robert F. Beers; Ervin F. Johnston; Thomas Glenn Keough

[57] ABSTRACT

Planar superconducting-normal-superconducting (SNS) Josephson microbridges and superconducting quantum interference devices (SQUIDs) with bridge widths of about 0.2 microns and lengths of about 0.1 micron or less are fabricated with the aid of a technique referred to as "shadow evaporation". The procedure permits the submicron dimensions to be set by edge film thickness and slant evaporation angle, both of which can be accurately measured. Microbridges have been constructed with vanadium banks or electrodes and gold-titanium bridges, although other materials can be used including superconducting metals for the bridge. It is expected that a refined version of this technique would be suitable for repeated batch fabrication of single and multiple Josephson microbridges.

10 Claims, 9 Drawing Figures

OPTICAL LITHOGRAPHIC TECHNIQUE FOR FABRICATING SUBMICRON-SIZED JOSEPHSON MICROBRIDGES

STATEMENT OF GOVERNMENT INTEREST

The invention described herein may be manufactured and used by or for the Government of the United States of America for governmental purposes without the payment of any royalties thereon or therefor.

CROSS REFERENCE TO A RELATED APPLICATION

This invention is related to an invention entitled "Fabrication of Submicron-Wide Lines With Shadow Depositions" by Edward C. Jelks and George L. Kerber, U.S. Patent Office Number 344341.

BACKGROUND OF THE INVENTION

Josephson junctions are becoming increasingly attractive for application in digital logic, magnetic field detection, and millimeter wave detection. The tunnel junction form of Josephson junction is already being highly developed by industry for ultrafast computers. Less attention has been given to microbridge Josephson junctions than tunnel Josephson junctions but they offer potentially significant advantages for high temperature operation as well as exhibiting other promising features associated with nonhysteretic behavior.

In the past, however, considerable difficulty has arisen in fabricating Josephson microbridges, primarily because of the small dimensions required. This is particularly true in the case of arrays of microbridges on the same chip, which must have repeatable device characteristics to be useful for applications such as digital logic and D.C. magnetometry. Typical methods used for the construction of these devices have been unsuitable for batch fabrication of arrays or required the use of electron beam lithography. This latter technique is costly and difficulty to use for 0.2 micrometer feature lithography, however, and is presently not feasible for repeatable production of features less than 0.1 micrometers. The present invention addresses these problems with a new fabrication technique that is entirely compatible with current integrated circuit technology for multi-micron dimensions and thus offers the potential of complex circuitry on a chip made up of Josephson microbridges. The use of large scale electron beam lithography coupled with this technique could produce features well under 0.1 micrometers and thus improved microbridge characteristics.

SUMMARY OF THE INVENTION

The present invention describes a thin film method of fabricating planar, submicron-sized, variable thickness Josephson microbridges and arrays of microbridges. The submicron features of Josephson microbridges are produced by the repeated use of "shadowed" regions created by evaporating material at slant angles to the vertical edges of thin films. This procedure allows the submicron dimensions of the devices to be set by edge film thickness and the slant evaporating angle, both of which can be accurately measured. In addition, since irregularities in the lateral edges of the shadow are correlated with one another, the width of the shadow region is uniform even for widths less than the roughness of the film edge. In accordance with the present invention, the microbridge structure consists of two wide superconducting electrodes or banks separated by a submicron-wide gap which is bridged by a thin, narrow metal strip. Since the metal strip forming the bridge is not fabricated simultaneously with the superconducting electrode structure, the strip can be either a superconductor, a normal metal, or a composite of different metal layers, and the bridge-bank thickness ratio can be varied over a wide range. Furthermore, the choice of superconductor for the electrodes is not limited; for example, refractory elements such as niobium or vanadium and high critical temperature compounds and alloys can be used for the electrode material.

It is, therefore, the object of this invention to provide a means of batch fabrication of planar Josephson microbridges and arrays of microbridges with submicronsized features determined by accurately measureable quantities.

Another object is to provide a technique of varying the ratio between the bridge and bank thicknesses.

Another object is to provide a means of varying the bridge and bank material composition independently.

Still another object is to provide a means of using refractory materials for the banks or electrode structure.

Details of the foregoing objects, features, and advantages of this invention will become apparent in the subsequent more detailed discussion and drawings.

DESCRIPTION OF THE PREFERRED EMBODIMENT

Figure 1A:
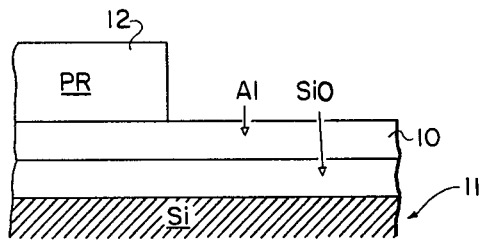
FIGS. 1a, 1b and 1c depict stages in the fabrication of a submicron-sized microbridge.

Referring now to the drawings and in particular to FIG. 1a, a bridge 15 is constructed first and is followed by the forming of the superconducting metal electrodes, or banks. A first step in making the bridge calls for a layer 10 of aluminum approximately 1000 Å thick deposited on top of a substrate 11 which, in this case, is a silicon oxide on silicon substrate. Next, a photoresist layer 12 such as the material commercially known under the designation Shipley 1350B is disposed over the aluminum surface in a prearranged pattern. One technique for disposing it on the surface is to spin it on the surface, that is, a wafer coated with the material spun is at a high rate so that the radial forces evenly distribute a thin coating as desired.

After the photoresist layer has been applied, exposed, and developed, the aluminum layer 10 is partially etched to undercut the photoresist edge. A mixture of two parts phosphoric acid, one part acetic acid and one part dionized water is applied for about ten minutes at room temperature to etch the aluminum layer. Optionally, chlorobenzene could shape an undercut photoresist profile, see FIG. 1b. It is to be noted in FIG. 1b that all of the aluminum layer 10 to the right of the photoresist layer 12 has been etched away and that the undercutting extends beneath a portion of the photoresist layer.

Figure 1B:
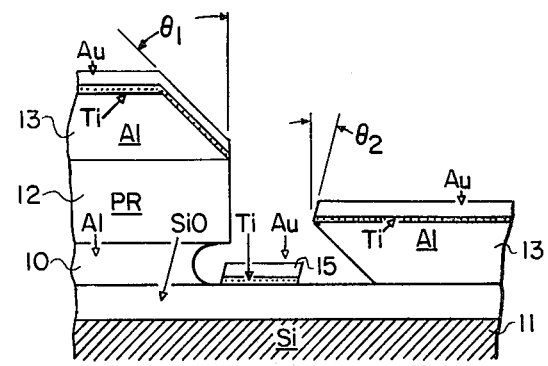

A layer 13 of aluminum now is deposited according to well established vacuum depositing methods at an angle of $\theta_1$ to the photoresist edge, here again see FIG. 1b. This shadowed deposition defines a long, submicron-wide opening to the underlying substrate. The desired material for the bridge, a gold/titanium bilayer in this case, now is deposited at an angle $\theta_2$ through the submicron wide opening located between the photoresist layer 12 and the upper left edge of right aluminum layer 13. After titanium and then gold have been deposited, the undesirable surrounding material can be removed by dissolving the photoresist in hot acetone followed by stripping the remaining aluminum layers with the phosphoric acid-acetic acid-deionized water mixture mentioned above.

It is necessary in the above fabrication process to attach substrate 11 to a copper heat sink (not shown) using a thermal grease (not shown) to avoid distortion of the photoresist by heating which attends the last two shadow deposition steps.

The aforedescribed technique lends itself to the fabrication of metal lines (microbridges) from about 0.1 micrometer to 0.3 micrometers wide using conventional photographic masks. Electrical continuity has been observed 88% of the time over at least twenty-five micrometer lengths. If an electron beam were used to expose the photoresist, it would be expected that considerably narrower and smoother lines could be generated.

Figure 1C:
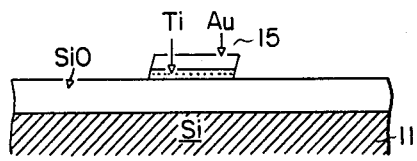
Figure 2A:
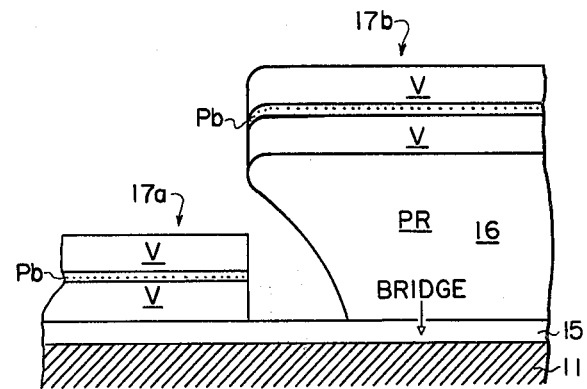
FIGS. 2a, 2b and 2c depict the fabrication sequence of the superconducting electrodes of an Josephson microbridge.
Figure 2B:
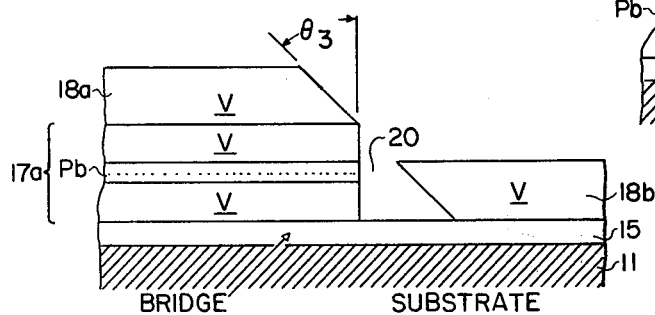
Figure 2C:
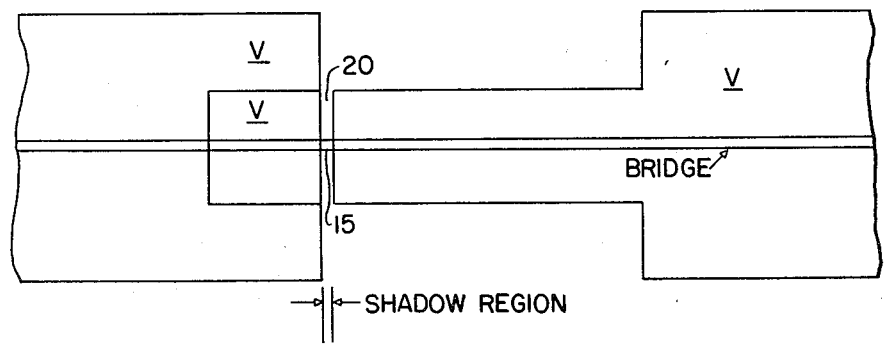

The process steps used to complete a microbridge device are depicted in FIGS. 2a through 2c. In this regard, bridge 15 in FIG. 1b has been fabricated on substrate 11 in accordance with the procedure set forth above. Bridge 15 in FIG. 2a is shown rotated 90 degrees from its position in FIG. 1c. The superconducting electrode on one side is formed with standard liftoff procedures using the 1350B photoresist layer 16 which partially covers bridge 15 and supporting substrate 11. This will be described in detail below. The use of a refractory superconductor material such as vanadium or niobium for the electrodes presents some special handling considerations. Unless precautions are taken, heating of the substrate may cause distortion of the photoresist layer and thus deterioration of the metal pattern. Mounting the substrates on copper plates of about ¼" thick and using thermal grease have helped reduce the problems associated with photoresist heating. A radiation shield (not shown) also is provided for additional heat shielding.

In addition, the tensile stress buildup in the vanadium films is compensated for by the addition of a thin (200 Å) compressive film such as lead or aluminum sandwiched between the thicker layers of vanadium, see FIG. 2a. No notable changes in the transition temperature ($T_c$) in the lead-vanadium films have been observed, so that operational capabilities remain predictable. Before the superconducting electrode materials are deposited on the bridge, it is essential to sputter-clean the bridge surface and the substrate to prevent contamination of the bridge-electrode interface by the lithographic chemicals. Even in the case of gold bridges, failure to sputterclean results in a series resistance of about 10-50 ohms at the interface. Exactly why this resistance is created is not clear; however, it may be due to an unwanted chemical reaction between the residual lithographic chemicals and the lower surface of the vanadium films.

Looking once again to FIG. 2a a photoresist layer 16 has been applied over bridge 15 and its underlying substrate and processed as follows. First, the photoresist and substrate is exposed to ultraviolet light through an appropriate mask. Then, the photoresist layer is treated in a chlorobenzene solution to achieve an undercut profile after developing. A vanadium lead laminate 17a and 17b is shadow deposited so that a left electrode laminate 17a is formed. Now the PR layer 16 and its superimposed laminate 17b are removed by dissolving the photoresist in acetone.

The second superconducting electrode is patterned with a lift-off process similar to that used to pattern the first. In this case, however, the superconducting electrode material is deposited at an angle $\theta_3$ with respect to the normal to the substrate surface where the upper exposed edge of the first superconductor electrode 17a ends. This final metal layer (18a and 18b) creates a submicron gap 20 between the two superconducting electrodes 17a-18a and 18b, see FIG. 2b.

The completed microbridge viewed from above at reduced scale is schematically depicted in FIG. 2c where the submicron line bridge 15 lies beneath the superconducting electrodes except in the shadow region (submicron gap 20). The width of the electrode gap, and hence the bridge length, is a function of the height of the laminate layer 17a and the angle $\theta_3$. This submicron dimension is therefore adjustable, establishable and reproducible. The above process is suited for constructing variable thickness microbridges using either superconducting or normal metals for bridge 15.

A number of single and double Josephson devices have been constructed using the above technique with vanadium for the electrodes and gold for the bridge (the 150 Å layer of titanium is used for adhesion of the gold to the substrate). The bridges have been approximately 150 Å to 250 Å thick, 0.15 to 0.25 micrometers wide and 0.08 to 0.15 micrometers long.

Figure 3A:
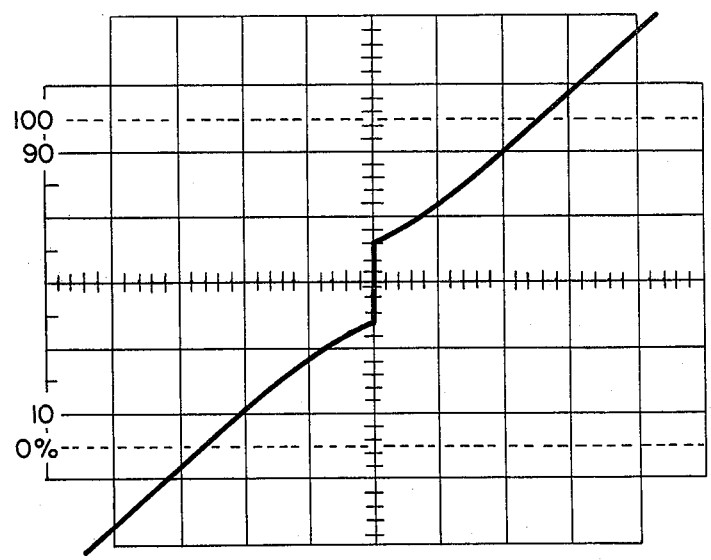
FIGS. 3a, 3b and 3c depict characteristics of a device fabricated in accordance with the teachings of this inventive concept.
Figure 3B:
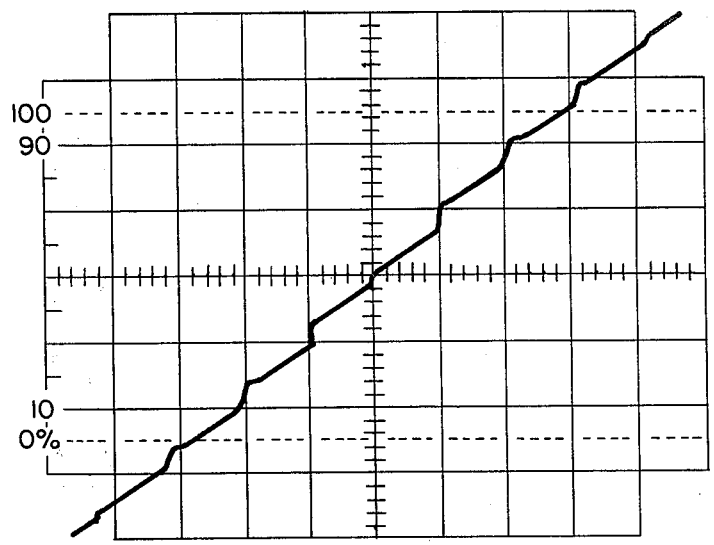
Figure 3C:
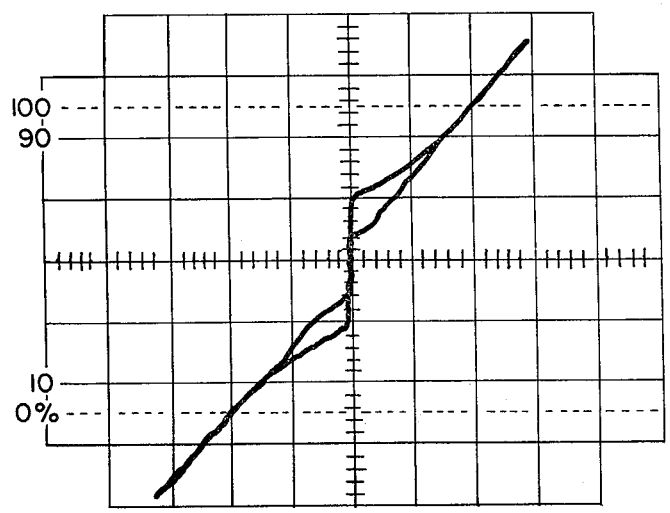

A current vs. voltage characteristic for a typical bridge at 2° Kelvin with no applied magnetic fields is shown in FIG. 3a (vert: 20 μA/div; horiz: 20 μV/div.). For a batch of twelve single bridges tested on three separate wafers the static I-V characteristics were consistent with the resistively-shunted-junction model (reference) up to the voltage at which it appeared that heating of the electrodes was important. The voltage was typically about 300 microvolts at 2° Kelvin, for example. The I-V characteristics were observed down to about 0.4 $T_C$ (superconductor electrode). Steps on the I-V characteristic produced by microwave radiation at 10 GHz are shown in FIG. 3b, same scales as FIG. 3a. One other phenomena was the quantum interference that was observed in the three double-junction devices tested. FIG. 3c shows the I-V characteristic of a double-junction device at two different applied magnetic field strengths (vert: 5 μA/div.; horiz: 5 μV/div).

Obviously, many modifications and variations of the present invention are possible in the light of the above teachings. It is therefore to be understood that within the scope of the appended claims the invention may be practiced otherwise than as specifically described.

What is claimed is:

1. A method of fabricating planar, Josephson microbridge devices and arrays of microbridge devices each microbridge device having a bridge dimensioned with a length and width each less than 0.3 micrometer and which extends between a first superconducting electrode and a second superconducting electrode all of which are disposed on a planar substrate, comprising:

depositing a first layer of a metal on the substrate;

disposing a first photoresist layer on top of at least a portion of the deposited first metal layer;

etching the first deposited metal layer to undercut the photoresist layer;

depositing a second metal layer on the substrate to define a submicron wide exposed substrate strip next to and beneath the photoresist layer, the depositing of the second metal layer is at a first acute angle to the normal of the substrate over the upper edge of the photoresist layer to define the dimensions of the exposed substrate strip;

depositing the microbridge material on the exposed substrate strip to produce the submicron-sized microbridge, the depositing of the microbridge material is at a second acute angle to the normal of the substrate over the upper edge of the second deposited metal layer and under a lower exposed edge of the photoresist layer to define the lateral dimensions of the submicron-sized microbridge;

dissolving the photoresist layer; and stripping away the first and second metal layers of the substrate to leave the submicron-sized bridge on the substrate, the submicron-sized bridge is included in a microbridge device by depositing the first and second superconducting electrodes along the submicron-sized microbridge to assure the creation of a submicron gap between the electrodes.

2. A method according to claim 1 in which the depositing of the first and second superconducting electrodes includes:

applying a second photoresist layer over at least a portion of the submicron-sized microbridge and the substrate, treating second photoresist layer to create an undercut profile, depositing a superconducting metal layer over the second photoresist layer and onto an exposed portion of the submicron-sized microbridge and the substrate, removing the second photoresist layer and the part of the superconductor electrode metal layer covering it;

depositing still more of the superconductor electrode metal layer at a third acute angle to the normal of the upper edge first deposited superconductor electrode metal layer to define a submicron gap between the superconductor electrode linked by the submicron wide bridge.

3. A method according to claim 2 in which the problems associated with photoresist distortion by heating are reduced by mounting the substrate on a copper plate and using thermally-conducting grease between the substrate and copper plate to promote heat flow.

4. A method according to claim 3 in which the superconducting metal is refractory and tensile therein is reduced by sandwiching a lead film between successive layers of the deposited superconducting electrode metal.

5. A method according to claim 4 in which the superconducting electrode is made of more than one layer of deposited vanadium.

6. A method according to claim 5 in which the vanadium layers sandwich a lead layer.

7. A method according to claim 6 in which the planar substrate is a silicon/silicon oxide substrate, the submicron-sized microbridge is a gold bridge deposited on the substrate, and a first and second vanadium electrodes are deposited on the substrate and portions of the gold bridge to expose a submicron-length of the gold bridge that extends across a submicron gap between the first and second vanadium electrodes.

8. A method according to claim 7 in which a titanium layer is interposed between the substrate and the gold microbridge to aid in adhesion of the gold to the substrate.

9. A method according to claim 8 in which the width of the gold microbridge is about 0.2 micrometers and the gap is about 0.1 micrometer.

10. A method according to claim 9 further including a compressive metal layer of lead deposited on at least one exposed surface of a vanadium layer to reduce a tensile stress buildup.

* * * * *